United States Patent
Murata

(10) Patent No.: US 10,830,830 B2
(45) Date of Patent: Nov. 10, 2020

(54) BATTERY MONITORING DEVICE FOR VEHICLE-MOUNTED BATTERY

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Hayaki Murata, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

(*) Notice: Subject to any disclaimer, the term of this patent is extended or adjusted under 35 U.S.C. 154(b) by 12 days.

(21) Appl. No.: 16/347,915

(22) PCT Filed: Nov. 6, 2017

(86) PCT No.: PCT/JP2017/039872
§ 371 (c)(1),
(2) Date: May 7, 2019

(87) PCT Pub. No.: WO2018/092620
PCT Pub. Date: May 24, 2018

(65) Prior Publication Data
US 2019/0285705 A1    Sep. 19, 2019

(30) Foreign Application Priority Data

Nov. 17, 2016   (JP) ................................. 2016-223766

(51) Int. Cl.
*G01R 31/396*        (2019.01)
*G01R 31/3835*       (2019.01)
(Continued)

(52) U.S. Cl.
CPC .......... *G01R 31/396* (2019.01); *B60L 58/10* (2019.02); *G01R 19/16523* (2013.01);
(Continued)

(58) Field of Classification Search
CPC .............. G01R 31/396; G01R 31/3825; G01R 19/16523; B60L 58/10; H02J 7/0063
(Continued)

(56) References Cited

U.S. PATENT DOCUMENTS 8,860,244 B2 * 10/2014 Hattori .................. H02J 7/1438
                                                                 307/9.1
9,583,958 B2 *  2/2017 Miyajima ................ H02H 7/18
(Continued)

FOREIGN PATENT DOCUMENTS

JP    2013-121246 A    6/2013
JP    2016-134962 A    7/2016
WO   2016-174854 A1   11/2016

OTHER PUBLICATIONS

International Search Report, Application No. PCT/JP2017/039872, dated Dec. 12, 2017. ISA/Japan Patent Office.

*Primary Examiner* — Reena Aurora
(74) *Attorney, Agent, or Firm* — Honigman LLP

(57) ABSTRACT

Provided is a battery monitoring device for a vehicle-mounted battery that can more accurately detect voltage in each location in the battery module and can protect a circuit if overcurrent and overvoltage occur. In the battery monitoring device for the vehicle-mounted battery, a power source line is electrically connected to a high voltage electrode portion, and is a path through which current flows from a high voltage electrode portion side without passing through a first fuse (first current interruption unit) of the high voltage signal line. The second Zener diode has a cathode that is electrically connected to the power source line and an
(Continued)

anode that is electrically connected to another one of the plurality of high voltage signal lines than the high voltage signal line.

2 Claims, 2 Drawing Sheets

(51) Int. Cl.
*B60L 58/10* (2019.01)
*G01R 19/165* (2006.01)
*H01M 10/48* (2006.01)
*H02H 7/18* (2006.01)
*H02J 7/00* (2006.01)
*H02J 7/02* (2016.01)

(52) U.S. Cl.
CPC ...... *G01R 31/3835* (2019.01); *H01M 10/482* (2013.01); *H02H 7/18* (2013.01); *H02J 7/00* (2013.01); *H02J 7/0021* (2013.01); *H02J 7/02* (2013.01); *H01M 2220/20* (2013.01)

(58) Field of Classification Search
USPC .......................................................... 324/434
See application file for complete search history.

(56) References Cited

U.S. PATENT DOCUMENTS

| | | | |
|---|---|---|---|
| 9,660,517 B2* | 5/2017 | Hirota | H02M 1/15 |
| 2010/0268492 A1* | 10/2010 | Matsuura | B60L 58/14 |
| | | | 702/63 |
| 2014/0210612 A1 | 7/2014 | Shibata | |
| 2014/0247013 A1 | 9/2014 | Mizoguchi | |
| 2016/0241054 A1* | 8/2016 | Matsumoto | H01M 10/34 |

* cited by examiner

BATTERY MONITORING DEVICE FOR VEHICLE-MOUNTED BATTERY

CROSS-REFERENCE TO RELATED APPLICATIONS

This application is the U.S. national stage of PCT/JP2017/039872 filed Nov. 6, 2017, which claims priority of Japanese Patent Application No. JP 2016-223766 filed Nov. 17, 2016, the contents of which are incorporated herein.

TECHNICAL FIELD

The present disclosure relates to a battery monitoring device for a vehicle-mounted battery.

BACKGROUND

If battery modules used in vehicles have a plurality of battery cells (unit batteries) connected in series, then it is desirable to be able to detect the voltages of the battery cells and to monitor the status of the battery cells, and JP 2013-121246A discloses a configuration that realizes this. These battery systems have voltage measurement units (battery monitor ICs) that monitor the voltages of the battery cells via voltage measurement lines (voltage signal lines). With these battery systems, if, for example, an excessive current is applied to the battery modules from outside, then overvoltage protection diodes connected in parallel to the battery cells breakdown, current flows via fuses (first fuses), and the voltages between the voltage measurement lines are clamped (limited) by the overvoltage protection diodes. If the current that flows through the fuses is excessive, the fuses will melt and protect the voltage measurement units from overcurrent flowing therethrough.

With the battery system disclosed in JP 2013-121246A, power source voltage is supplied to the voltage measurement unit via the voltage measurement line that is connected to the electrode that has the highest potential among the electrodes of battery cells that are within the range that is monitored by the voltage measurement unit. Specifically, an end of a fuse is connected to the positive electrode of the battery cell with the highest potential and the other end of the fuse is both connected to a line that is connected to an input terminal of the voltage measurement unit via a resistor, and connected to a power supply line for supplying operating voltage to the voltage measurement unit. In other words, the fuse and wiring connected to the battery cell with the highest potential serve as a shared path through which flow the current of the power source line that flows into the voltage measurement unit via the power supply line and the current of the signal line that flows into the voltage measurement unit via the resistor. With this configuration, the drive current for driving the voltage measurement unit (that is, the current that flows through the power supply line) may be subject to a voltage drop at the fuse and the wiring adjacent to the fuse, which together form the shared path Thus, because this drop in voltage arises from the drive current in the shared path, there is concern that the voltage measurement line that uses the shared path as a portion of its measurement path will also be affected by the drop in voltage and that this will lead to less accurate measurements.

The present disclosure was made based on the circumstances described above, and an object thereof is to provide a battery monitoring device for a vehicle-mounted battery that can more accurately detect the voltages at various locations of the battery module and can protect the circuitry if overcurrent or overvoltage occur.

SUMMARY

A battery monitoring device for a vehicle-mounted battery according to an aspect of the present disclosure monitors at least a portion of a battery module as a monitoring range, and has a configuration where a plurality of unit batteries are connected in series. The battery monitoring device for the vehicle-mounted battery comprises a signal line group that includes a plurality of voltage signal lines, each of the voltage signal lines being electrically connected to an inter-battery electrode portion of the plurality of unit batteries connected in series or electrically connected to a terminal electrode portion of the battery module, one of the voltage signal lines being configured as a high voltage signal line that is electrically connected to a high voltage electrode portion that has the highest voltage among the voltage electrode portions in the monitoring range of the battery module. A protection circuit includes a plurality of first Zener diodes, each of the first Zener diodes being connected between signal lines of the plurality of voltage signal lines in parallel to a unit battery, and includes an anode that is connected to the voltage signal line on a negative electrode side of the unit battery that is connected in parallel, and includes a cathode that is connected to the voltage signal line on a positive electrode side of the unit battery that is connected in parallel. A current interruption unit group includes a plurality of first current interruption units, each of the first current interruption units being interposed in one of the voltage signal lines and, when overcurrent occurs in any of the voltage signal lines, the first current interruption unit that is interposed in the voltage signal line in which overcurrent occurred interrupts the current. A power source line is electrically connected to the high voltage electrode portion, and is a path through which current flows from the high voltage electrode portion side without passing through the first current interruption unit of the high voltage signal line. A monitoring circuit unit operates based on power source voltage that is applied to the power source line and detects at least an input voltage that is input via the voltage signal line or the voltage between signal lines of the plurality of voltage signal lines. A second Zener diode whose cathode is electrically connected to the power source line and whose anode is electrically connected to a signal line other than the high voltage signal line in the plurality of voltage signal lines. A second current interruption unit is interposed, in the power source line, between the high voltage electrode portion and a connection node of the second Zener diode, and interrupts current that flows through the power source line when overcurrent occurs in the power source line.

Advantageous Effects of Disclosure

With the voltage monitoring device described above, it is possible for the monitoring circuit unit to detect the voltages of the electrode portions of the unit batteries that constitute the battery module. It also possible for the circuit to be protected by the first Zener diodes breaking down if overvoltage is applied to the voltage signal lines and for the first current interrupting unit to interrupt current if a large current flows to the voltage signal lines. Moreover, the power source line for supplying power source voltage to the monitoring circuit unit is electrically connected to a high voltage electrode portion and is a path through which current flows from the high voltage electrode portion side without passing through a first current interruption unit of a high voltage signal line. With this configuration, it is possible to reliably suppress the drive current that flows through the power source line from affecting a drop in voltage that occurs in the first current interruption unit of the high voltage signal line. In other words, it is possible to suppress the drive current that flows through the power source line from affecting the voltage that is input to the monitoring circuit unit via the high voltage signal line, and the monitoring circuit unit can more accurately detect the voltage at the part that is electrically connected to the high voltage signal line. Furthermore, a second Zener diode is provided that has a cathode electrically connected to the power source line and has an anode electrically connected to a signal line other than the high voltage signal line, making it possible to protect the circuit as the second Zener diode will break down when overvoltage is applied to the power source line, and also making it possible to suppress the power source line and the high voltage signal line from affecting each other via the second Zener diode.

DETAILED DESCRIPTION OF PREFERRED EMBODIMENTS

The following are desirable examples of the present disclosure.

The anode of the second zener diode may also be electrically connected to a second voltage signal line that has the next highest voltage after the high voltage line, of the plurality of voltage signal lines.

Thus, it is possible to prevent the power source line and the high voltage signal line from affecting each other via the second zener diode, and it is also possible to set a smaller breakdown voltage for the second zener diode.

First Embodiment

The following describes a first embodiment for carrying out the present disclosure.

Figure 1:
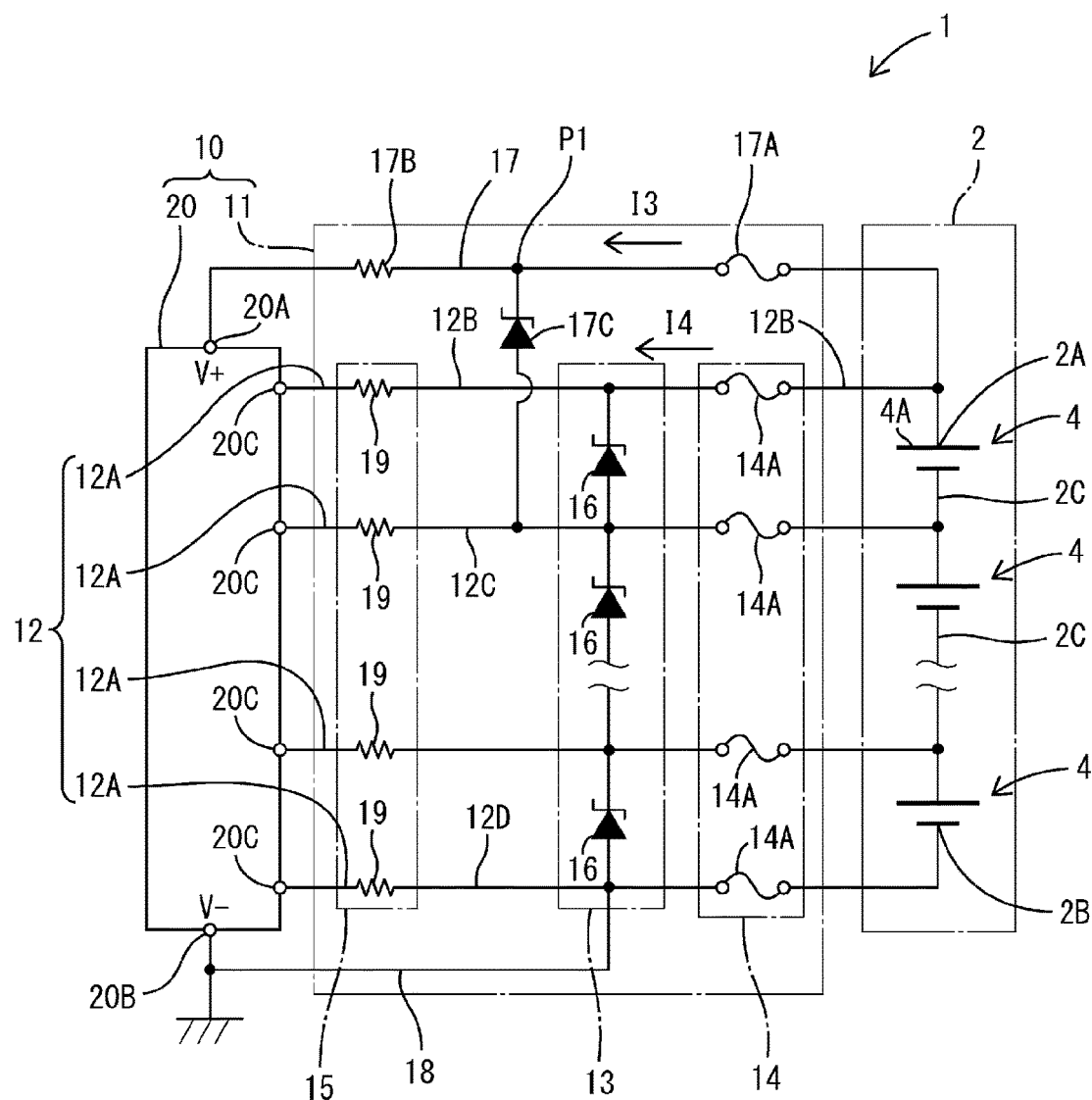
FIG. 1 is a circuit diagram showing an example of a vehicle-mounted battery system that has a battery monitoring device according to a first embodiment.

A vehicle-mounted battery system 1 as shown in FIG. 1 includes a battery module 2 for a vehicle (hereinafter also referred to as "battery module 2") in which a plurality of unit batteries 4 are connected in series, and a battery monitoring device 10 for a vehicle-mounted battery (hereinafter also referred to as "battery monitoring device 10") that detects the voltage at various locations of the battery module 2.

The battery module 2 is a storage means that can function as a power source for a vehicle, and may be installed in a vehicle as, for example, a power source for a drive motor for an electric vehicle (such as an EV or an HEV). The battery module 2 is configured as a serial connection in which a plurality of unit batteries 4 that are constituted by, for example, lithium-ion secondary batteries, nickel-hydrogen secondary batteries, and the like are connected in series.

In the battery module 2 shown in FIG. 1, a high voltage electrode portion 2A (hereinafter also referred to as "electrode portion 2A") is a terminal electrode portion of a high voltage side (high potential side) of the series connection in which the unit batteries 4 are connected in series. A low voltage electrode portion 2B (hereinafter also referred to as "electrode portion 2B") is a terminal electrode portion of a low voltage side (low potential side) of the series connection in which the unit batteries 4 are connected in series. Inter-battery electrode portions 2C (hereinafter also referred to as "electrode portions 2C") are electrode portions provided between the unit batteries of the series connection in which a plurality of unit batteries 4 are connected in series. With this configuration, the high voltage electrode portion 2A has the highest voltage of the plurality of electrode portions that are included in this monitoring range (the range in which voltage can be detected in the battery module 2) of the battery monitoring device 10. Also, the low voltage electrode portion 2B has the lowest voltage of the plurality of electrode portions that are included in the monitoring range of the battery monitoring device 10. Note that with the example in FIG. 1, the entire battery module 2 is in the monitoring range of the battery monitoring device 10.

The battery monitoring device 10 includes a protection circuit 11 and a monitoring circuit unit 20. Note that in FIG. 1 and FIG. 2, some of the unit batteries 4 are omitted, as are circuit elements that correspond to the omitted unit batteries 4.

The protection circuit 11 includes a signal line group 12, a protection circuit unit 13, a current interruption unit group 14, a resistor unit group 15, a power source line 17, a ground wire 18, and the like.

The signal line group 12 includes a plurality of voltage signal lines 12A, with the electrode portions 2A, 2B, and 2C of the battery module 2 being electrically connected to respective voltage signal lines 12A. With the example in FIG. 1, the high voltage electrode portion 2A, the low voltage electrode portion 2B, and the inter-battery electrode portions 2C of the unit batteries 4 that are connected in series are respectively connected to ends of the plurality of voltage signal lines 12A, and the other ends of the plurality of voltage signal lines 12A are respectively connected to the input terminals 20C of the monitoring circuit unit 20. The voltage signal lines 12A are paths that electrically connect the electrode portions to the monitoring circuit unit 20, and first fuses 14A and resistors 19 are interposed in the voltage signal lines 12A. Of this plurality of voltage signal lines 12A, a signal line 12B is the signal line that is electrically connected to the high voltage electrode portion 2A (the electrode portion that has the highest voltage in the range of the battery module 2 that is monitored).

The high voltage electrode portion 2A is an electrode portion at one end of the battery module 2, and is the electrode portion that has the largest voltage (potential) in the battery module 2. The low voltage electrode portion 2B is an electrode portion at the other end of the battery module 2, and is the electrode portion that has the smallest voltage (potential) in the battery module 2. The electrode portions 2C are electrically connected to the positive electrode of one unit battery 4 and the negative electrode of another unit battery 4, of the unit batteries 4 that are connected in series. Also, in regards to the voltage (potential) of these electrode portions 2C, in the circuit shown in FIG. 1, an electrode portion 2C that is closer to the electrode portion 2A has a larger voltage than an electrode portion 2C that is farther away from the electrode portion 2A.

The protection circuit unit 13 includes a plurality of first Zener diodes 16. The first Zener diodes 16 are connected in parallel to the unit batteries 4 between signal lines of the plurality of voltage signal lines 12A, with the anodes of each first Zener diode 16 being connected to the voltage signal line 12A on the negative electrode side of the unit battery 4 that is connected in parallel, and the cathode being connected to the voltage signal line 12A on the positive electrode side of the unit battery 4 that is connected in parallel.

The protection circuit unit 13 has a plurality of first zener diodes 16. The first zener diodes 16 are connected in parallel to the unit batteries 4 and are between the signal lines of the plurality of voltage signal lines 12A, with the anodes of the first zener diodes 16 being connected to the voltage signal lines 12A of the negative electrode side of the unit batteries 4 that are connected in parallel, and the cathodes being connected to the voltage signal lines 12A of the positive electrode side of the unit batteries 4 that are connected in parallel.

Specifically, the first Zener diodes are respectively connected between two adjacent voltage signal lines 12A at locations between the plurality of voltage signal lines 12A that are connected to the electrode portions 2B and 2C, and the electrode portion 12B that is connected to the electrode portion 2A. Also, the voltage signal lines 12A whose connection nodes to the battery module 2 are adjacent have a lower voltage (potential) the closer they are to the electrode portion 2B and have a higher voltage (potential) the closer they are to the electrode portion 2A. One end of the first Zener diodes 16 is respectively connected to one of the voltage signal lines 12A, while the other end of the first Zener diodes 16 is connected to the voltage signal line 12A that has the next highest voltage (potential) after the voltage signal line 12A to which the one end is connected. With this configuration, the first Zener diodes 16 are connected to the signal lines, and thus connected in parallel to the unit batteries 4.

The cathodes of the first Zener diodes 16 are connected to those voltage signal lines 12A that have the relatively high voltage (potential) of the two voltage signal lines 12A to which the respective first Zener diode 16 is connected, while the anodes of the Zener diodes 16 are connected to the voltage signal lines 12A that have the next lowest voltage (potential) after the voltage of the voltage signal lines 12A that are connected to the cathodes. Due to being connected in this way, if, for example, the voltage between the two voltage signal lines 12A to which a first Zener diodes 16 is connected rises to a predetermined value, then current flows from the cathode of this first Zener diode 16 to the anode side and the voltage between the two ends of this first Zener diode 16 (that is, the voltage between the signal lines) is clamped below a predetermined voltage.

The current interruption unit group 14 has a plurality of first fuses 14A that are equivalent to a first current interruption unit. The first fuses 14A are interposed in the voltage signal lines 12A and, when there is an overcurrent in any of the voltage signal lines 12A in which the first fuses 14A are interposed, they interrupt the current in that voltage signal line 12A. If there is an overcurrent (specifically, overcurrent large enough to melt a fuse) in any of the voltage signal lines 12A, then the first fuse 14A (first current interruption unit) of the current interruption unit group 14 that is interposed in the voltage signal line 12A in which the overcurrent has occurred will melt and interrupt current that flows through this voltage signal line 12A. The first fuses 14A are interposed in the voltage signal lines 12A between the connection nodes of the first Zener diodes 16 and the unit batteries 4.

The resistor unit group 15 includes a plurality of resistors 19. The resistors 19 are provided in the voltage signal lines 12A between the first Zener diodes 16 and the monitoring circuit unit 20. The resistors 19 serve to suppress current from flowing into the monitoring circuit unit 20 via the voltage signal lines 12A in which the resistors 19 are provided.

The monitoring circuit unit 20 is configured as an integrated circuit (voltage monitoring circuit IC) that monitors battery voltage, is connected to another end of the power source line 17, which will be described later, and operates on power source voltage applied to the power source line 17. The monitoring circuit unit 20 detects at least one of the input voltages that are input via the voltage signal lines 12A and the voltages between signal lines of the plurality of voltage signal lines 12A. Specifically, the monitoring circuit unit 20 has a plurality of input terminals 20C to which the plurality of voltage signal lines 12A are respectively connected, and analogue voltage signals, which indicate the voltages at the connection nodes where the voltage signal lines 12A are connected to the monitoring circuit unit 20, are input to the input terminals 20C.

Also, by detecting the potential difference between the voltage signal lines 12A based on these analogue voltage signals, it is possible to detect the terminal voltages of the unit batteries 4. Note that the monitoring circuit unit 20 may also include an AD converter that converts the inputted analogue signals into digital signals, and may also include a control circuit (such as a CPU) that determines, controls, and the like based on the analogue voltage signals. Also, the monitoring circuit unit 20 is provided with a power source input terminal 20A and a grounding terminal 20B. The power source input terminal 20A is a terminal for inputting, from outside, power source voltage necessary when operating the monitoring circuit unit 20. The grounding terminal 20B is a terminal for inputting, from outside, a reference voltage (the ground voltage serving as the reference in the vehicle-mounted battery system 1) serving as the reference in the monitoring circuit unit 20.

The power source line 17 is electrically connected to the high voltage electrode portion 2A, and is a path through which current flows from the high voltage electrode portion 2B side without passing through the first fuse 14A (first current interruption unit) of the high voltage signal line 12B. One end of the power source line 17 is connected to the high voltage electrode portion 2A, and power source voltage that corresponds to the voltage of the high voltage electrode portion 2A (specifically, about the same voltage as that of the high voltage electrode portion 2A) is applied to the power source line 17. One end of a second Zener diode 17C, which will be described later, is electrically connected to the power source line 17, and furthermore, a second current interruption unit, constituted by a second fuse 17A, and a power source resistor unit 17B are interposed in the power source line 17.

The second Zener diode 17C has a cathode that is electrically connected to the power source line 17, and an anode that is electrically connected to another signal line other than the high voltage signal line 12B of the plurality of voltage signal lines 12A. Specifically, the anode of the second Zener diode 17C is electrically connected to the connection node between the resistor 19 and the first Zener diode 16 in a second voltage signal line 12C that has the next highest voltage after the voltage of the high voltage signal line 12B of the plurality of voltage signal lines 12A.

The second fuse 17A is an example of a second current interruption unit, is interposed in the power source line 17 between a connection node P1 of the second Zener diode 17C and the high voltage electrode portion 2A, and serves to interrupt current that flows through the power source line 17 when an overcurrent occurs in the power source line 17.

Specifically, the second fuse 17A melts if a current large enough to melt the second fuse 17A flows through the power source line 17, and the current that flows through the power source line 17 is thus interrupted.

The power source resistor unit 17B is provided between the power source input terminal 20A of the monitoring circuit unit 20 and the connection node P1 of the second Zener diode 17C in the power source line 17, and serves to suppress the current flowing into the power source input terminal 20A of the monitoring circuit unit 20.

The ground wire 18 is electrically connected to a voltage signal line 12A (a low voltage signal line 12D), which is electrically connected to the low voltage electrode unit 2B, is also electrically connected to the grounding terminal 20B of the monitoring circuit unit 20, and is furthermore also electrically connected to a grounding portion that is provided in the vehicle. The ground wire 18 is maintained at a ground potential (0V).

The following exemplifies the effects of the configuration described above.

With the battery monitoring device 10 described above, it is possible for the monitoring circuit unit 20 to detect the voltage of the electrode portions of the unit batteries 4 that constitute the battery module 2, and it is also possible to protect the circuit by the first Zener diodes 16 being caused to break down if an overvoltage is applied to the voltage signal lines 12A, and for the first fuses 14A (the first current interruption unit) to interrupt current if an excessive current flows through the voltage signal lines 12A.

Furthermore, this configuration also has the effect of improving the detection accuracy. This aspect of the effects of the present configuration will be explained by way of comparison to a comparative example.

Figure 2:
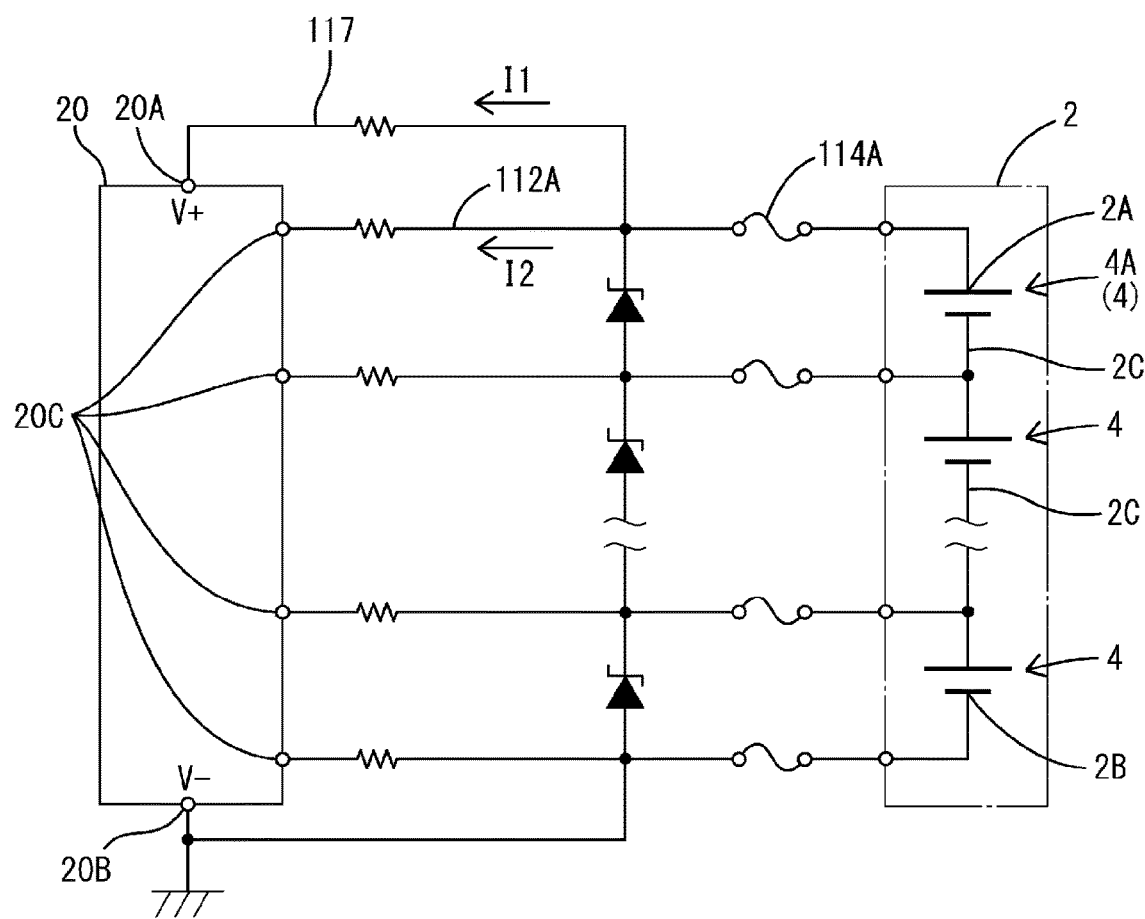
FIG. 2 is a circuit diagram showing an example of a vehicle-mounted battery system that has a battery monitoring device according to a comparative example.

First, the operation of the battery system of the comparative example will be described. As shown in FIG. 2, in the battery system of the comparative example, one end of a fuse 114A is connected to the electrode portion 2A of the battery module 2, and the other end of the fuse 114A is connected to a path of a voltage signal line 112A that is connected to an input terminal 20C of the monitoring circuit unit 20 via a resistor, as well as to a path of a power source line 117 for supplying operating voltage to the monitoring circuit unit 20. In other words, the fuse 114A that is connected to the electrode portion 2A that has the highest potential and the wires adjacent thereto serve as a shared path through which flow a drive current I1 that flows into the monitoring circuit unit 20 via the power source line 117, and a current I2 that flows into the monitoring circuit unit 20 via the voltage signal line 112A. With this configuration, the drive current for driving the monitoring circuit unit 20 (that is, current that flows through the power source line 117) is subject to a voltage drop in the fuse 114A and the wiring portion adjacent thereto, that serve as the shared path. Thus, because this drop in voltage arises from the drive current I1 in the shared path, the voltage signal line 112A that uses this shared path as a portion of its measurement path will be affected by the drop in voltage which will result in less accurate detection.

In contrast, in the battery monitoring device 10 in the first embodiment, as shown in FIG. 1, the power source line 17 for supplying power source voltage to the monitoring circuit unit 20 is electrically connected to the high voltage electrode portion 2A and is a path through which current flows from the high voltage electrode portion 2A side without passing through the first fuse 14A (the first current interruption unit) of the high voltage signal line 12B. With this configuration, the drive current I3 that flows through the power source line 17 is not effected by the voltage drop at the first fuse 14A (first current interruption unit) of the high voltage signal line 12B because the drive current I3 that flows through the power source line 17 is generated without flowing through the first fuse 14A of the high voltage signal line 12B nor the wiring adjacent thereto. Accordingly, it is possible to prevent voltage that is input to the monitoring circuit unit 20 via the high voltage signal line 12B from being affected by a drive current I3 that flows through the power source line 17, and for the monitoring circuit unit 20 to more accurately detect voltage of a part (the high voltage electrode portion 2A) that is electrically connected to the high voltage signal line 12B.

Furthermore, because a second Zener diode 17C is provided such that its cathode is electrically connected to the power source line 17 and its anode is electrically connected to a signal line other than the high voltage signal line 12B, it is possible to protect the circuit by the second Zener diode 17C being caused to break down when an overvoltage is applied to the power source line 17, and to prevent the power source line 17 and the high voltage signal line 12B from affecting each other through the second Zener diode 17C.

In this configuration, the anode of the second Zener diode 17C is electrically connected to a signal line (the second voltage signal line 12C) that has the next highest voltage of the plurality of voltage signal lines 12A, after the voltage of the high voltage signal line 12B.

Thus, it is possible to prevent the power source line 17 and the high voltage signal line 12B from affecting each other via the second Zener diode 17C, and to set the breakdown voltage of the second Zener diode 17C to a lower voltage.

OTHER EMBODIMENTS

The present disclosure is not limited to the first embodiment described above with reference to the drawings, and embodiments such as those described below are also included in the technical scope of the present disclosure.

In the embodiment described above, an example is given in which the anode of the second Zener diode 17C is connected to the second voltage signal line 12C that has the next highest voltage after the high voltage signal line 12B, but the anode of the second Zener diode 17C may also be electrically connected to a voltage signal line 12A other than the high voltage signal line 12B and the second voltage signal line 12C. In this case, it is preferable to match the number (number connected in series) of the second Zener diodes 17C and the number of the unit batteries 4 that are connected in parallel, and change the size of the Zener diodes. For example, if there is a large number of second Zener diodes 17C and unit batteries 4 connected in parallel, it is preferable that Zener diodes that have a large breakdown voltage are used, and if there is a small number of second Zener diodes 17C and unit batteries 4 connected in parallel, it is preferable that Zener diodes that have a small breakdown voltage are used.

The embodiment described above gives an example of the battery module 2 in which the battery module is constituted by a plurality of unit batteries, but there is no limit to the number thereof. Also, it is preferable that a plurality of voltage signal lines are connected to parts of the battery module, but there is no limit to the number thereof.

The embodiment described above gives an example in which the voltage signal lines 12A are connected to the terminal electrode portions (the high voltage electrode portion 2A and the low voltage electrode portion 2B) of the battery module 2 and all of the inter-battery electrode portions 2C, but the voltage signal lines may also be connected to the terminal electrode portions of the battery module and only one of, or a plurality of, the inter-battery electrode portions. For example, the voltage signal lines may be connected to groups of unit batteries that are connected in series.

In the embodiment described above, secondary batteries such as nickel-hydrogen batteries and lithium-ion batteries are given as examples of the unit batteries 4, but a storage means such as an electric double-layered capacitor may be also be used instead of these secondary batteries.

The embodiment described above gives an example in which the battery module 2 is provided outside of the battery monitoring device 10, but the battery monitoring device may also include a battery module. In other words, the battery monitoring device may include, or may not include, a battery module as a constituent element. For example, if the battery monitoring device includes a battery module as a constituent element, a circuit assembly that has a substrate that is provided with a Zener diode, a signal line, and the like, and a battery module may also be configured as a single body.

The embodiment described above gives an example in which the battery monitoring device 10 monitors the voltage of the electrode portions of the battery module 2 with the entirety of one battery module 2 as the monitoring range, but the battery monitoring device 10 may also monitor the voltage of the electrode portions that are provided in the monitoring range, with the monitoring range being only a part of one battery module 2. Alternatively, if a plurality of battery modules are provided in the vehicle, the battery monitoring device may also be provided such that the plurality of battery modules are monitored as the monitoring range, and battery monitoring devices may also be provided such that they correspond to the battery modules, with the battery modules as the respective monitoring range. For example, if a battery system is to be monitored in which a plurality of battery modules are connected in series, it is preferable that battery monitoring devices are provided such that they correspond with the battery modules, and that the monitoring circuit units are provided such that they correspond with the battery monitoring devices.

The invention claimed is:

1. A battery monitoring device for a vehicle-mounted battery that monitors at least a portion of a battery module as a monitoring range, the battery module having a configuration where a plurality of unit batteries are connected in series, the battery monitoring device for the vehicle-mounted battery comprising:
a signal line group that includes a plurality of voltage signal lines, each of the voltage signal lines being electrically connected to an inter-battery electrode portion of the plurality of unit batteries connected in series or electrically connected to a terminal electrode portion of the battery module, one of the voltage signal lines being configured as a high voltage signal line that is electrically connected to a high voltage electrode portion that has the highest voltage among the voltage electrode portions in the monitoring range of the battery module;
a protection circuit that includes a plurality of first Zener diodes, each of the first Zener diodes being connected between signal lines of the plurality of voltage signal lines in parallel to a unit battery, and having an anode that is connected to the voltage signal line on a negative electrode side of the unit battery that is connected in parallel, and having a cathode that is connected to the voltage signal line on a positive electrode side of the unit battery that is connected in parallel;
a current interruption unit group that includes a plurality of first current interruption units, each of the first current interruption units being interposed in one of the voltage signal lines and, when overcurrent occurs in any of the voltage signal lines, the first current interruption unit that is interposed in the voltage signal line in which overcurrent occurred interrupts the current;
a power source line that is electrically connected to the high voltage electrode portion, and is a path through which current flows from the high voltage electrode portion side without passing through the first current interruption unit of the high voltage signal line;
a monitoring circuit unit that operates based on power source voltage that is applied to the power source line, and detects at least an input voltage that is input via the voltage signal line or the voltage between signal lines of the plurality of voltage signal lines;
a second Zener diode whose cathode is electrically connected to the power source line and whose anode is electrically connected to a signal line other than the high voltage signal line in the plurality of voltage signal lines; and
a second current interruption unit that is interposed, in the power source line, between the high voltage electrode portion and a connection node of the second Zener diode, and interrupts current that flows through the power source line when overcurrent occurs in the power source line.

2. The voltage monitoring device for the vehicle-mounted battery according to claim 1, wherein the second Zener diode has an anode that is electrically connected to a second voltage signal line that has the next highest voltage in the plurality of voltage signal lines after the voltage of the high voltage signal line.

* * * * *